United States Patent
Chang et al.

(10) Patent No.: US 8,624,849 B2
(45) Date of Patent: Jan. 7, 2014

(54) TOUCH ACTUATED SENSOR CONFIGURATION INTEGRATED WITH AN OLED STRUCTURE

(75) Inventors: Shih Chang Chang, Cupertino, CA (US); Steven Porter Hotelling, San Jose, CA (US)

(73) Assignee: Apple Inc., Cupertino, CA (US)

( * ) Notice: Subject to any disclaimer, the term of this patent is extended or adjusted under 35 U.S.C. 154(b) by 614 days.

(21) Appl. No.: 12/426,912

(22) Filed: Apr. 20, 2009

(65) Prior Publication Data

US 2010/0265188 A1    Oct. 21, 2010

(51) Int. Cl.
*G06F 3/041*   (2006.01)
*G09G 3/30*    (2006.01)

(52) U.S. Cl.
USPC .............................. 345/173; 445/24; 345/76

(58) Field of Classification Search
USPC ......................................................... 345/173
See application file for complete search history.

(56) References Cited

U.S. PATENT DOCUMENTS

| | | | |
|---|---|---|---|
| 5,483,261 A * | 1/1996 | Yasutake | 345/173 |
| 5,488,204 A * | 1/1996 | Mead et al. | 178/18.06 |
| 5,825,352 A | 10/1998 | Bisset et al. | |
| 5,835,079 A | 11/1998 | Shieh | |
| 5,880,411 A * | 3/1999 | Gillespie et al. | 178/18.01 |
| 6,188,391 B1 * | 2/2001 | Seely et al. | 345/173 |
| 6,310,610 B1 * | 10/2001 | Beaton et al. | 345/173 |
| 6,323,846 B1 * | 11/2001 | Westerman et al. | 345/173 |
| 6,690,387 B2 * | 2/2004 | Zimmerman et al. | 345/684 |
| 6,885,157 B1 * | 4/2005 | Cok et al. | 315/169.3 |
| 7,015,894 B2 * | 3/2006 | Morohoshi | 345/156 |
| 7,184,064 B2 * | 2/2007 | Zimmerman et al. | 345/684 |
| 7,436,114 B2 * | 10/2008 | Wang et al. | 313/504 |
| 7,663,607 B2 * | 2/2010 | Hotelling et al. | 345/173 |
| 8,479,122 B2 * | 7/2013 | Hotelling et al. | 715/863 |
| 2004/0080267 A1 * | 4/2004 | Cok | 313/512 |
| 2004/0212603 A1 | 10/2004 | Cok | |
| 2005/0073507 A1 * | 4/2005 | Richter et al. | 345/174 |
| 2005/0126831 A1 * | 6/2005 | Richter et al. | 178/18.01 |
| 2006/0026521 A1 * | 2/2006 | Hotelling et al. | 715/702 |
| 2006/0097991 A1 * | 5/2006 | Hotelling et al. | 345/173 |
| 2006/0197753 A1 * | 9/2006 | Hotelling | 345/173 |
| 2007/0018969 A1 * | 1/2007 | Chen et al. | 345/173 |
| 2007/0063985 A1 * | 3/2007 | Yamazaki et al. | 345/173 |
| 2007/0097278 A1 * | 5/2007 | Rho et al. | 349/12 |
| 2007/0242055 A1 * | 10/2007 | Lai | 345/173 |
| 2008/0062147 A1 * | 3/2008 | Hotelling et al. | 345/174 |
| 2008/0165139 A1 * | 7/2008 | Hotelling et al. | 345/173 |

(Continued)

FOREIGN PATENT DOCUMENTS

| | | | |
|---|---|---|---|
| JP | 2000-163031 A | 6/2000 | |
| JP | 2002-342033 A | 11/2002 | |

(Continued)

OTHER PUBLICATIONS

International Search Report mailed Jan. 24, 2011, for PCT Application No. PCT/US2010/031483, three pages.

(Continued)

*Primary Examiner* — Amare Mengistu
*Assistant Examiner* — Sarvesh J Nadkarni
(74) *Attorney, Agent, or Firm* — Morrison & Foerster LLP

(57) ABSTRACT

Briefly, in accordance with one embodiment, a passive touch sensor configuration is integrated with an OLED structure.

18 Claims, 10 Drawing Sheets

(56) References Cited

U.S. PATENT DOCUMENTS

| | | | |
|---|---|---|---|
| 2008/0165158 A1* | 7/2008 | Hotelling et al. | 345/174 |
| 2008/0309633 A1* | 12/2008 | Hotelling et al. | 345/173 |
| 2009/0078972 A1* | 3/2009 | Hwang et al. | 257/290 |
| 2009/0090694 A1* | 4/2009 | Hotelling et al. | 216/41 |
| 2009/0091551 A1* | 4/2009 | Hotelling et al. | 345/174 |

FOREIGN PATENT DOCUMENTS

| | | |
|---|---|---|
| JP | 2004-213413 A | 7/2004 |
| KR | 10-2004-0093041 | 11/2004 |
| KR | 10-2006-0125712 | 12/2006 |
| WO | WO-2010/123779 A2 | 10/2010 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Chang-Wook Han, et al.; Distinguished Paper: 15-inch XGA Dual-Plate OLED Display (DOD) Based on Amorphous Silicon (a-Si) TFT Backplane.

Russian Search Report mailed Mar. 26, 2013, for Russian Patent Application No. 2011147009/08 filed Apr. 16, 2010, with English translation, 13 pages.

\* cited by examiner

TOUCH ACTUATED SENSOR CONFIGURATION INTEGRATED WITH AN OLED STRUCTURE

FIELD

This disclosure relates generally to the integration of a touch actuated sensor configuration with an organic light emitting diode (OLED) structure.

BACKGROUND

Many types of input devices are available for performing operations in a computing system, such as buttons or keys, mice, trackballs, joysticks, touch sensor panels, touch screens, or the like. Touch screens may come in a variety of forms, such as a touch sensor panel, which may include a clear or transparent panel with a touch-sensitive surface and a display device, which may include a display positioned partially or fully behind the touch panel so that the touch-sensitive surface may cover at least a portion of the viewable area of the display device. Touch screens generally allow a user to perform various functions by touching (e.g., physical contact) the touch sensor panel or by near-field proximity to it. In general, a computing system may register the touch event and may be capable of performing one or more actions based at least in part on registration of the touch event.

Touch screens, or devices that may incorporate, or be compatible with, touch screen technology, seem to be increasingly popular. Their popularity with consumers may be partly attributable to their relative ease or versatility of operation, as well as their declining price. In addition, touch screens may also be increasingly popular due, in part, to their generally decreasing overall size, their reliability, or their robustness. A corollary to these characteristics may be that, from a manufacturer's perspective, costs associated with producing devices including touch screens, or producing devices including touch screens with characteristics which are believed to be desirable for consumers, have decreased or become less onerous. Accordingly, there generally is a desire to continue to develop approaches or techniques believed to be desirable for consumers or end-users in terms of cost, performance or a combination thereof.

DETAILED DESCRIPTION

In the following description of embodiments, reference is made to the accompanying drawings which form a part hereof, and in which it is shown by way of illustration specific embodiments of claimed subject matter. It is to be understood that other embodiments may be used, for example, changes or alterations, such as structural changes, may be made. All embodiments, changes or alterations are not departures from scope with respect to intended claimed subject matter.

This disclosure relates generally to a passive touch actuated sensor configuration embodiment integrated with or in direct physical contact with an organic light emitting diode (OLED) structure embodiment in a module or integrated circuit (IC) embodiment. In this context, a touch actuated sensor configuration may refer to a configuration of touch sensors, including a surface, in which touch sensors of the configuration are responsive to direct physical contact with (e.g., touching) or close proximity to the surface of the configuration or a portion thereof. It is noted also that the terms touch actuated sensor configuration, touch activated sensor configuration, touch sensor panel and touch sensor configuration may be used interchangeably throughout this specification. Likewise, in this context, a passive touch actuated sensor configuration may refer to a touch actuated sensor configuration in which it is not required that additional energy, regardless of form, be supplied to the overall touch sensor configuration or system for touch sensors of the configuration to be responsive.

In an example embodiment, a touch actuated sensor configuration embodiment may include an array of touch sensors integrated with an array of OLED pixels in a module or in an integrated circuit (IC). Here, the detection of a touch event by one or more touch sensors may be sensed by sense circuitry and processed or otherwise interpreted. The interpreted touch data may result in a processor or other circuit electrically activating pixels of the array to change the display, as described in more detail below. OLED structures may provide potential advantages over possible alternative display technologies, depending at least in part on the particular application. For example, OLED structures typically do not employ light valves or similar technology.

Figure 1:
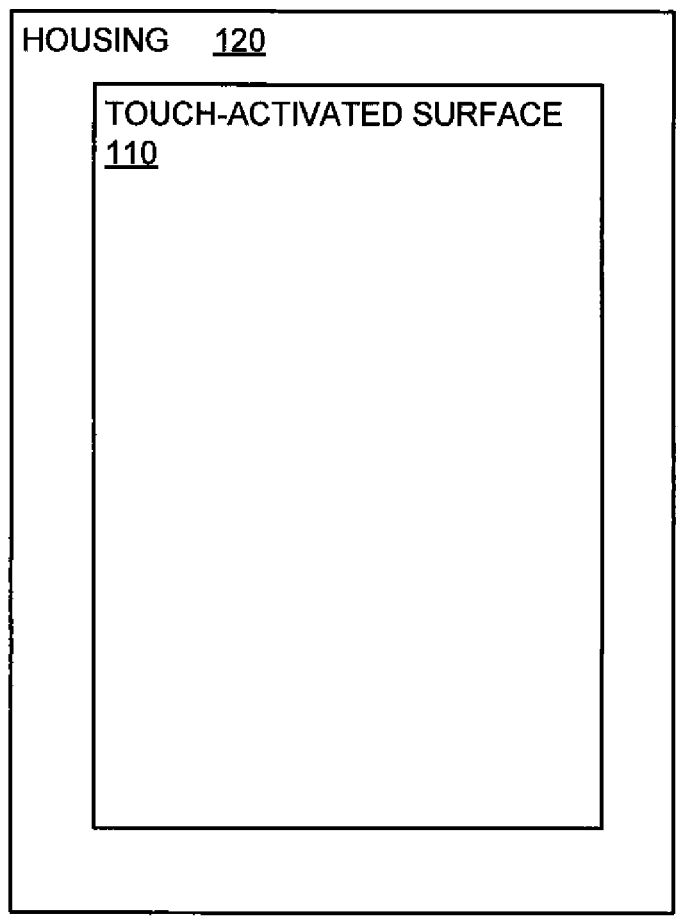
FIG. 1 is a plan view illustrating an example of a hand held device embodiment.

Turning to the figures, FIG. 1 is a plan view illustrating an example of a hand held device embodiment 100. It is noted that claimed subject matter is not limited in scope to a hand held device. This is simply one example embodiment. Rather, claimed subject matter may be employed in connection with any one of a host of possible devices, including a computing system, a mobile phone, a personal digital assistant, or a set top box, just to name a few examples. However, for purposes of illustration and without limitation, in this example embodiment, a plan view of hand held device embodiment 100 is shown, including a touch sensitive or touch actuated or touch-activated surface 110 and a housing 120.

A touch surface, such as surface 110, may, in this context, sometimes also be referred to as a touch sensitive surface or a touch activated surface. In general, a touch sensitive surface may include a clear or transparent substrate with a configuration of sensors typically, but not necessarily, in contact with the substrate. A touch actuated sensor configuration may also be positioned in front of a display so that a touch sensitive surface covers at least a portion of a viewable area of the display. As indicated previously, for this particular embodiment, and as shall be explained in greater detail, an OLED structure embodiment may be employed here to provide a viewable area. The arrangement of this particular embodiment, for example, may allow a user to make selections or move a cursor, such as by touching a portion of a touch sensitive surface positioned in front of a display with an object (e.g., a finger), or by placing the object in close proximity to the surface. In general, a touch sensitive surface may recognize and electronically register a touch or other direct physical contact or a near-touch with the touch sensitive surface via touch sensors connected to processing components or circuitry within the hand held device, for example, capable of processing such actions, gestures or surface contacts. Therefore, a computing system including circuitry or processors, for example, may interpret the registered touches or near-touches and perform an action based at least in part on processing by the computing system. Of course, as used herein, the term computing system may refer to a specific or special purpose computing system. For example, in this instance, a computing system to process touch events or the like is described.

Figure 2:
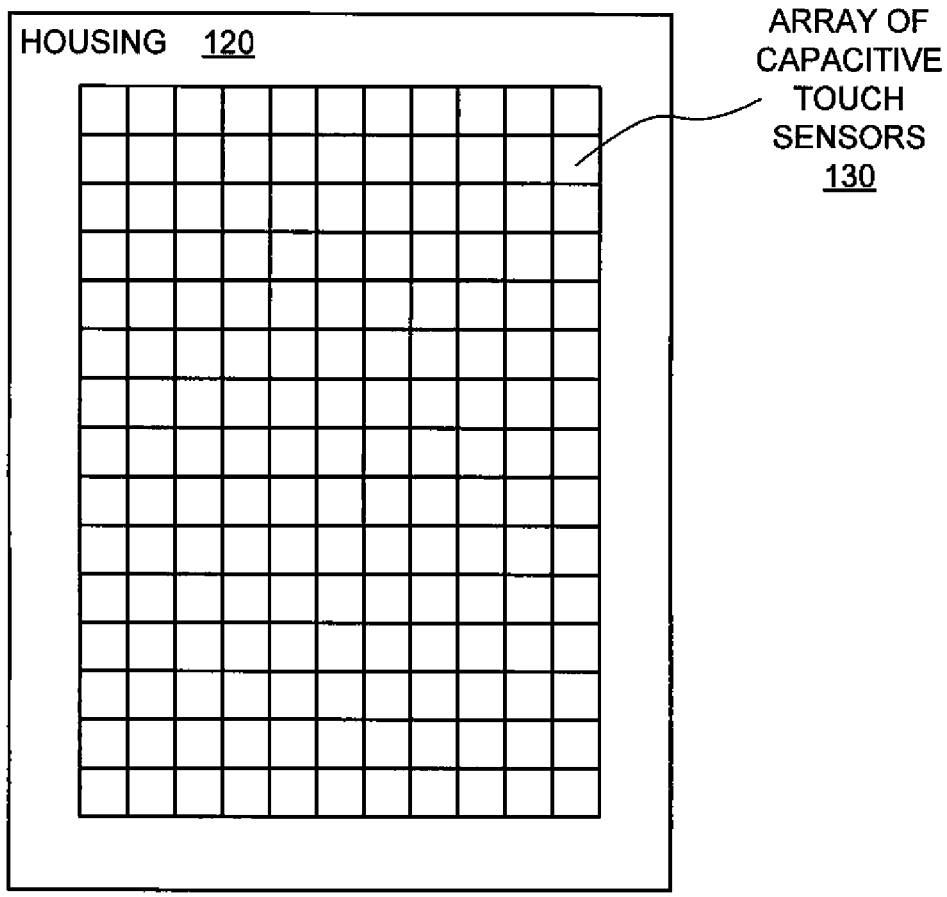
FIG. 2 is a plan view illustrating the example hand held device of embodiment of FIG. 1 in greater detail.

FIG. 2 is a plan view illustrating the example hand held device embodiment of FIG. 1 in greater detail. This particular embodiment, without limitation, illustrates hand held device embodiment 100 including an array of capacitive touch sensors 130 under a surface of a display (e.g., touch glass). For this particular embodiment, as suggested previously, an array of capacitive touch sensors may form a touch sensitive surface over at least a portion of a viewable area of a display screen. Again, in this particular embodiment, the viewable area may be provided by an OLED structure embodiment that shall be described in more detail later. It should be understood that this general illustration of an array of capacitive touch sensors 130 and hand held device 100 is merely a schematic depiction to aid the understanding of one of ordinary skill in the art. Hand held device 100, housing 120, and array of capacitive touch sensors 130, for example, are not illustrated to scale—particularly capacitive touch sensors 130. Furthermore, while a possible configuration using a particular sensing technology, here capacitive, is illustrated schematically, claimed subject matter is not limited to employing only capacitive touch sensor technology. Accordingly, many different configurations, touch sensing technologies, or various manufacturing processes may be employed without any departure from or with respect to claimed subject matter scope. It is, therefore, understood that any or all configurations, technologies, or processes, or the like, are intended to fall within the scope of claimed subject matter. What is provided herein are simply illustrative examples thereof.

As suggested previously, many different sensing approaches or technologies may be used in conjunction with a touch actuated sensor configuration embodiment integrated with an OLED structure embodiment. For example, a touch actuated sensor configuration embodiment may utilize, but is not limited to, touch actuated sensing technologies which may employ resistive, optical, surface acoustic, or capacitive technology, or any combinations thereof, just to a name a few. While for particular embodiments, disclosed herein, a capacitive touch actuated sensor configuration is illustrated in detail, it is of course understood that any or all other approaches or techniques may also or alternatively be utilized in connection with an OLED structure embodiment integrated with a touch sensor configuration embodiment.

Referring again to FIG. 2, a touch actuated sensor configuration may utilize capacitive sense technology. For this particular embodiment, a configuration of touch sensors having respective touch sensing locations may be formed. For example, one or more electrical structures may include a pattern of conductive traces (e.g., drive and sense lines) arranged in a manner so as to sense a change in capacitance which may be occasioned by an object, such as a finger, touching, contacting or hovering over a touch sensitive surface of a configuration that may include an array of touch sensors at particular touch points or touch locations. For example, an array of touch sensors may be formed from a pattern of conductive traces. As an object approaches a touch sensitive surface, one or more touch sensors of the configuration at particular touch sensing points or locations may experience a change in capacitance occasioned by proximity to the object. By detecting a change in capacitance at one or more touch sensing points or locations, and by noting the particular location or position associated with the change in capacitance, a sensing circuit may detect and register one or more touch events, such as, for example, an image of touch. After being detected and registered, touch events may be processed or otherwise used to at least in part control operation of an electronic device, such as for one or more operations of hand held device 100, by way of example. It is noted that throughout this specification, with respect to the operation of a touch sensor, the terms sensing points, sensing locations, touch point, touch locations or the like are used interchangeably.

Although a variety of particular embodiments are possible, configurations or arrangements for use in a touch actuated sensor configuration may include "self" capacitive or "mutual" capacitive configurations. In a "self" capacitive configuration, for example, capacitance may be measured relative to some reference, such as a ground or ground plane. In a "mutual" capacitive configuration, capacitance between drive and sense lines may be measured. Accordingly, "self" or "mutual" capacitive configurations may have similar or common aspects with respect to structural or electrical arrangements employed as well as dissimilar aspects with respect to structural or electrical arrangements employed, as described immediately below.

In a "mutual" capacitance sensing arrangement or configuration embodiment, for example, sensing locations may be formed by a crossing of patterned conductors formed from spatially separated conductive lines or traces. In one particular embodiment, conductive traces may lie in substantially parallel planes, the conductive traces of a particular plane being referred to here as being substantially co-planar, the substantially parallel planes in this particular embodiment otherwise being relatively close in proximity. Furthermore, substantially co-planar conductive traces may be oriented to be substantially parallel. However, conductive traces from different planes may be oriented so as to be substantially perpendicular in direction. That is, substantially co-planar conductive traces lying in a first plane having a first orientation or direction may be substantially perpendicular to substantially co-planar conductive traces lying in a second or in another plane having a second orientation or direction.

For example, in one embodiment, drive lines may be formed on a first layer in a first direction and sensing lines may be formed on a second layer in a second direction substantially perpendicular to the first direction such that drive and sense lines may "cross" one another at various touch sensing locations, albeit the drive lines being on a different layer of the configuration than the sense lines. It is noted herein that for the purposes of this patent application, the term "on" is not intended to necessarily refer to directly on. For example, a second layer may be formed on a first layer without the two layers being in direct physical contact. Thus, there may, continuing with the example, be additional layers or other material between these first and second layers. Notwithstanding the examples provided above, it should be understood that other non-perpendicular (e.g., non-orthogonal) orientations of the traces in the two planes are also possible.

A variety of other arrangements or configuration embodiments are also possible to provide a capacitance sensing arrangement or configuration, although claimed subject matter is not intended to be limited to any particular one. For example, conductive traces may be formed on different sides of a substrate. Conductive traces that may include shapes such as diamonds that cross in the manner discussed above may also be formed on one side of a substrate with an insulating separation, such as a dielectric, separating the traces at crossover locations. Conductive traces may also be formed on different substrates with the substrates being oriented so that the conductive traces lie in different substantially parallel planes while being on different layers. Employing a separation between drive and sense lines, in this particular embodiment, may result in capacitive coupling or capacitively coupled nodes between sense and drive lines at common locations or crossing locations that otherwise lie in different substantially parallel planes, as described above. In such an embodiment, these capacitively coupled locations may form an array of touch sensors.

In another example, an array of touch sensors may be formed from conductive traces and shapes such as patches and columns formed on the same layer on the same side of a substrate in a single-sided ITO (SITO) configuration, for example. In a SITO configuration, the drive lines may be formed from a row of patches of conductive material that may be connected through conductive traces and metal in the border areas of the panel. The sense lines may be formed as columns or connected patches of conductive material. Other SITO configurations are also possible. Therefore, claimed subject matter is not limited in scope to this particular description. In some SITO embodiments, electrical activation or stimulation of a drive line may result in mutual capacitance between adjacent drive and sense line patches or columns, for example. A finger or other object may result in a change in this mutual capacitance that may be detected by sensing circuits. Of course, these are merely example embodiments, and claimed subject matter is not intended to be limited in scope to these or any other particular embodiments.

A "self" capacitive configuration embodiment, in contrast, may measure capacitance relative to a reference ground plane. Also, a self capacitive embodiment typically employs an array or other arrangement of conductive patches or pads, such as Indium Tin Oxide (ITO) pads or patches. It is noted, without limitation, that ground plane may be formed on the back side of a substrate, on the same side as an array of conductive pads or patches, but separated from the patches or pads, or on a separate substrate. We likewise note that claimed subject matter is not limited in scope to ITO. Rather, any transparent conductive material, such as, for example, ZTO, may likewise be employed or any combinations thereof. In a self-capacitance touch sensor configuration embodiment, self-capacitance of a sensor relative to the reference ground may be changed due at least in part to the presence of an object, such as a finger. In some self-capacitance embodiments, self-capacitance of conductive column traces, for example, may be sensed independently, and self-capacitance of conductive row traces may also be sensed independently.

In addition to different sensing approaches that may be used in conjunction with a touch actuated sensor configuration embodiment, there may also be different arrangements for a touch actuated sensor configuration embodiment. Some of these arrangements may depend at least in part on the manner or the processes utilized to form a touch actuated sensor configuration or a touch sensitive surface. For example, different arrangements may vary as to sensor or sensing point location as well as relative orientation of a touch surface to one or more of the touch sensors or sensing points. However, any or all arrangements are intended to be within the scope of claimed subject matter and, therefore, may be utilized with a host of possible touch actuated sensor configuration embodiments.

An aspect of an embodiment in which a touch actuated sensor configuration is integrated with an OLED structure relates to a process for manufacture or fabrication. For example, a touch actuated sensor configuration embodiment may be fabricated on one side of a substrate and an OLED structure embodiment may be fabricated on one side of another substrate in separate processes. The touch actuated sensor configuration embodiment and the OLED structure embodiment may be combined into a single module or IC so that the touch actuated sensor configuration embodiment and the OLED structure embodiment contact one another. Furthermore, in such an embodiment, one or more respective touch sensors of the touch actuated sensor configuration may be electrically connected to the OLED structure via a conductive paste, although claimed subject matter is not limited in scope in this respect. Other approaches are also available and intended to be included within claimed subject matter so that the touch actuated sensor configuration embodiment and the OLED structure embodiment may be physically, and in some embodiments, electrically connected, as described in more detail below.

Again, it is noted here that for this particular embodiment of an integrated module or integrated circuit (IC), for example, the touch actuated sensor configuration embodiment and the OLED structure embodiment may be fabricated by separate processes. Furthermore, in the particular embodiment, after fabrication, the touch actuated sensor configuration embodiment and the OLED structure embodiment may be physically, and in some embodiments, electrically connected. In one particular embodiment, for example, a conductive paste may be employed to form the electrical connections. It is noted that a variety of conductive pastes or other conductive materials may be employed and claimed subject matter is not limited in scope to a particular conductive paste; however, examples include a paste that may include a polymer or an adhesive and a conductive material, such as silver or gold. Likewise, typically a process may be employed to cure the conductive paste. As examples, heat may be applied, pressure may be applied, radiation may be applied, or any combination thereof.

One potential advantage of employing separate processes to fabricate the touch actuated sensor configuration embodiment and the OLED structure embodiment may be that OLEDs tend to be sensitive to high temperature or high pressure processes. On the other hand, high temperature or pressure processes typically are employed in the fabrication of a touch sensor configuration. Thus, employing separate fabrication processes may permit fabrication in a manner that is less likely to damage the OLED structure embodiment. Likewise, a process for curing a conductive paste typically involves less temperature or less pressure than a process to fabricate a touch actuated sensor configuration, again reducing the likelihood of damage to an OLED structure. Another potential advantage may be the ability to increase module or IC yield. For example, the touch actuated sensor configuration embodiment and the OLED structure embodiment may be tested after fabrication, but before being integrated. This may produce higher yields than otherwise might result.

Figure 3:
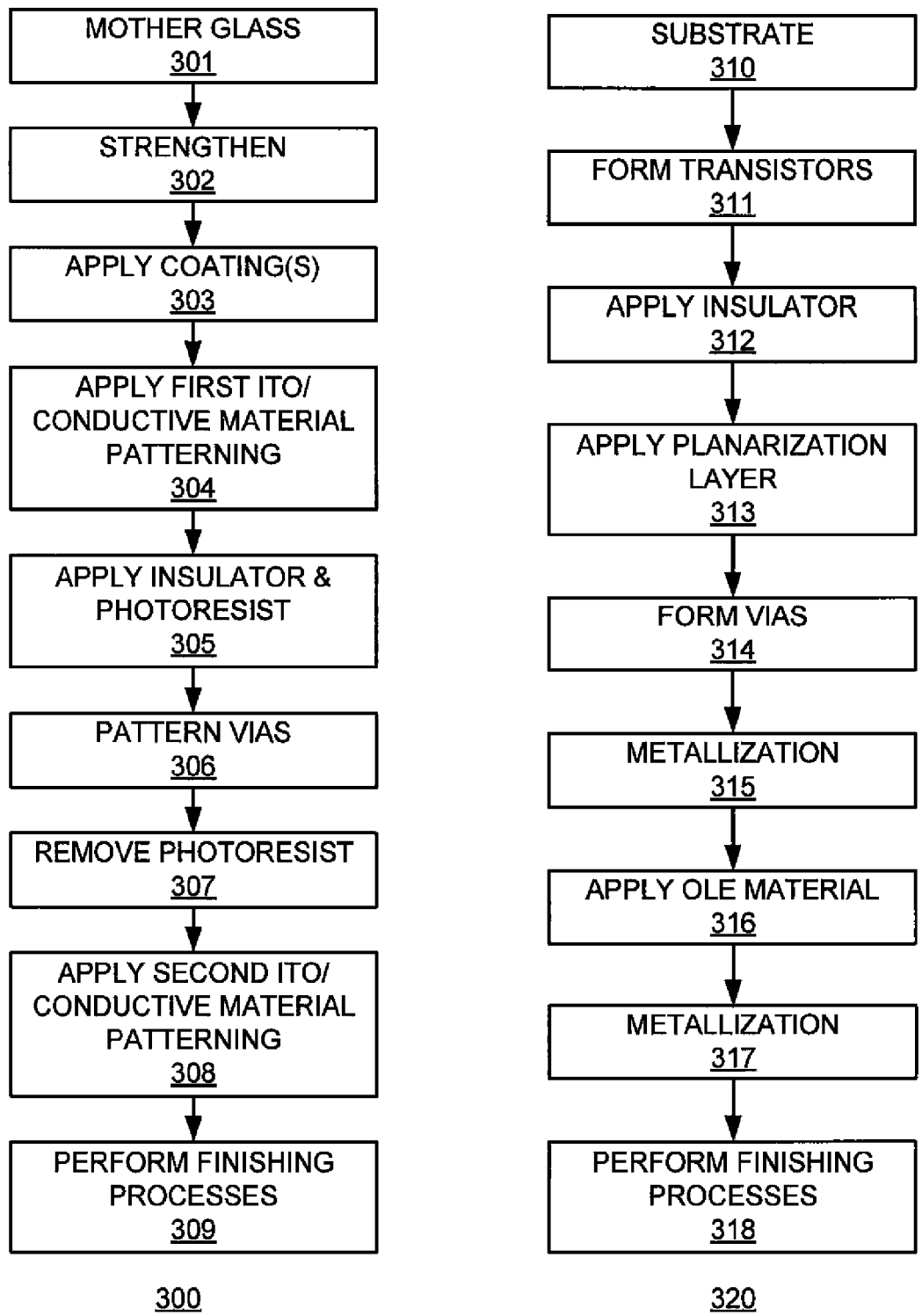
FIG. 3 is a first and a second process flow diagram respectively illustrating example process embodiments for making a touch actuated sensor configuration and for making an organic light emitting diode (OLED) structure.
Figure 4:
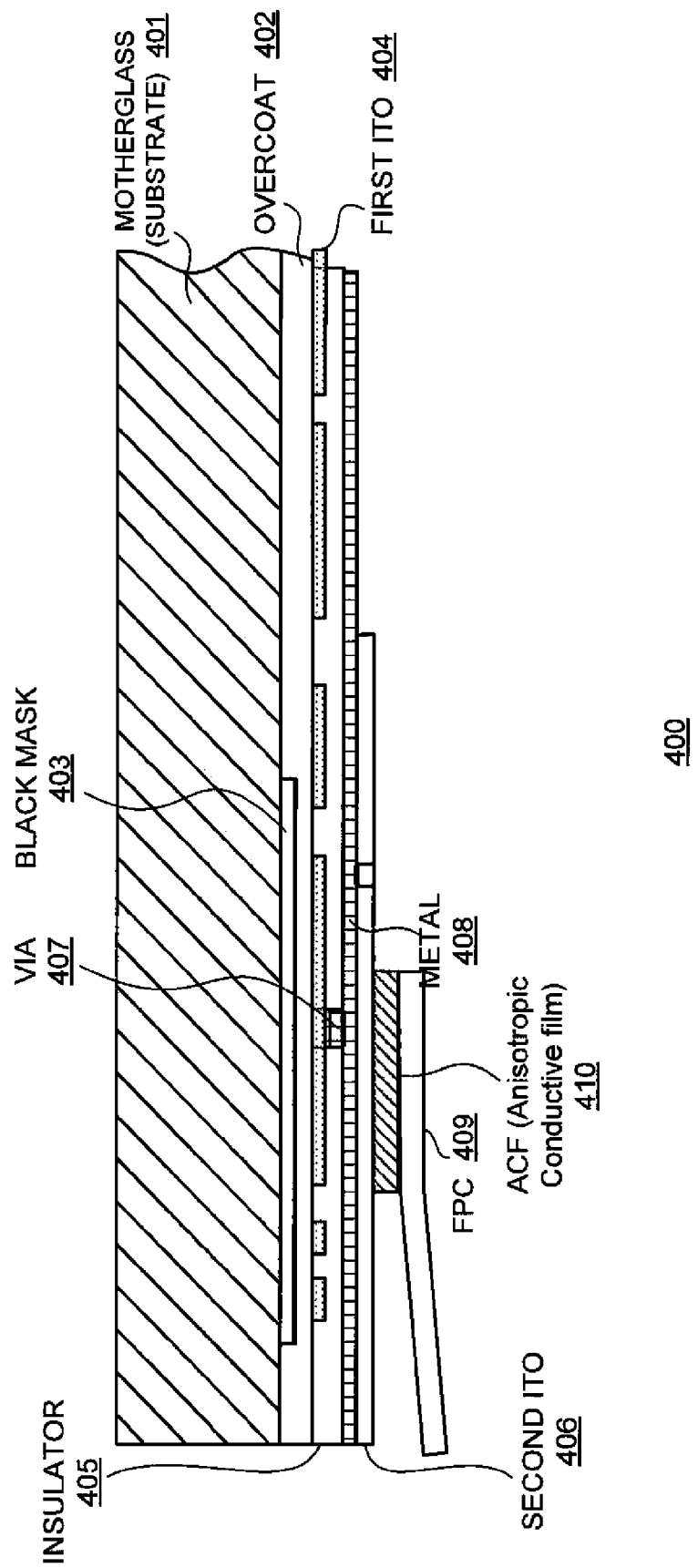
FIG. 4 is a side view illustrating an example touch actuated sensor configuration embodiment.

FIG. 3 is a flow chart or flow diagram illustrating an example process embodiment 300 for producing a touch sensor configuration embodiment. In the discussion below, reference is also made to a schematic diagram of a touch sensor configuration embodiment 400 as illustrated by FIG. 4. FIG. 3 also includes a flow chart or flow diagram illustrating an example process embodiment 320 for producing an OLED structure embodiment; however, that portion of FIG. 3 is discussed in more detail later. It should be understood that the process flow embodiments of FIG. 3 are provided as examples or illustrations. Therefore, it is further noted that some blocks may be omitted, additional blocks may be added to the flow, alternative blocks may be employed, or completely different fabrication processes involving a flow of different blocks may be utilized. Any and all other embodiments are intended to be included within the scope of claimed subject matter.

For this touch actuated sensor configuration embodiment, beginning at block 301, a substrate, such as a "motherglass," may be prepared for processing, from which a number of individual substrates may be produced, although it should be understood that cingulated substrates may also be used. Reference now is made here to FIG. 4, which is a cross-sectional side view diagram of a touch actuated sensor configuration embodiment 400. Therefore, this configuration embodiment includes motherglass 401, as shown. Typical materials which may be used as a substrate include materials having properties such as being relatively inert to subsequent processing, not being opaque to radiation, or providing electrical insulation. For example, suitable materials for a substantially transparent substrate may include glass, plastic, ceramic, metallic, organic or inorganic materials, or any combination thereof. Likewise, at least some of these example materials may also be flexible or rigid.

Chemical strengthening may be performed on the "motherglass," as shown by block 302, which may involve employing a nitric acid bath at a high heat, resulting in compressive forces or stresses at the surface layer of the glass and tensile stresses at the inside core of the glass. Various coatings may be employed, illustrated at block 303, such as an anti-glare coating, which may include particle-embedded silicon dioxide, an anti-reflective coating, a black mask coating on selected regions, or an application of an overcoat layer. These various coating or layers may be applied using a variety of techniques, which may include printing, roller coating, or sputtering followed by etching of unwanted areas, as non-limiting examples. Of course, in some embodiments, such coatings may be omitted.

A clear or transparent overcoat may be formed, which may include a clear or transparent polymer curable with ultraviolet (UV) light. This is illustrated, for example, in FIG. 4 by overcoat 402. This coating may smooth over black mask areas, such as 403 in FIG. 4, for example, in some embodiments. Likewise, this coating may in some embodiments form a substantially planar surface for subsequent Indium Tin Oxide (ITO) sputtering or conductive material (e.g., metal) patterning at block 304. As suggested, ITO or other conductive material may be sputtered, or otherwise applied or deposited, and patterned, illustrated in FIG. 4 by 404. Depending at least in part on the particular configuration, conductive lines or conductive pads or patches may be patterned. At block 305, an insulator may be formed over the patterned ITO or other conductive material, illustrated in FIG. 4 by 405. An insulator may have dielectric properties. For example, insulator 405 may be formed so that a second layer of ITO or other conductive material may be later formed, although claimed subject matter is not limited in scope in this respect.

Additionally, at block 305, a photoresist may be employed. The photoresist may subsequently be patterned for the formation of vias, as indicated at block 306. FIG. 4, for example, illustrates via 407. A photoresist may be employed, among other things, to protect various structures underlying the photoresist from subsequent processing or manufacturing operations, such as metal sputtering, as only one example. Subsequent processing may be commenced in particular locations by removing photoresist at those locations, as indicated at block 307.

At block 308, depending on the particular embodiment, a second ITO or conductive material layer, illustrated in FIG. 4 by 406, and additional conductive traces (e.g., metal), illustrated in FIG. 4 by 408, may be formed using lithography, selective deposition using a stencil mask, blanket deposition, or other techniques, to create row or column traces, for example. The patterning of metal and an ITO or conductive material layer may be done with a photoresist, a single photo-exposure and one or two etching operations, as examples. The dielectric insulator previously formed may thus permit the ITO or conductive material layers to exhibit mutual capacitance at crossover points resulting in touch sensors at these locations. Alternatively, in an embodiment employing single layer ITO (SITO), ITO patches or pads on a single layer may form the touch sensors, with mutual capacitance formed across adjacent (or nearby) drive and sense regions.

It is noted that a host of manufacturing processes or operations may be involved in fabrication of a particular touch actuated sensor configuration embodiment, such as to fabricate additional layers, for example, that have not been mentioned specifically here. Nonetheless, at block 309, scribing, separating or various other finishing processes may be performed as desired. Thus, for example, the "motherglass" may produce individual parts for subsequent processing. In addition, individual parts may undergo further processing, such as mechanical or chemical polishing, grinding, shaping, or cleaning, to provide examples.

The example process embodiment illustrated in FIG. 3, and the example touch sensing configuration embodiment illustrated in FIG. 4, represent merely one approach. As suggested previously, for example, sensors or sensor locations may be formed on a single side of a single substrate, on opposite sides of a single substrate, or on one side of two different substrates. Furthermore, single ITO (SITO) or double ITO (DITO) layers of patterned ITO may be employed to form touch sensor or touch sensor locations. Again, any or all arrangements are intended to be within the scope of claimed subject matter and, therefore, may be utilized with a host of possible touch actuated sensor configuration embodiments.

Depending at least in part on a particular application and a particular embodiment, the number of touch sensors or their configuration may vary considerably. For example, these may vary based, at least in part, on a desired resolution or sensitivity for a particular embodiment. Similarly, these may also vary depending at least in part on a desired transparency. Likewise, an array of touch sensors may be arranged in a Cartesian or rectangular coordinate system. As one example embodiment, drive lines may be formed as horizontal rows, while the sense lines may be formed as vertical columns (or vice versa), thus forming a plurality of touch sensors that may be considered as having distinct x and y coordinates. This approach is depicted, albeit simplified, in example hand held device 100 at FIG. 2. In another approach, an array of ITO pads or patches may be arranged in a Cartesian or rectangular coordinate system. Likewise, a polar coordinate system embodiment may be employed. For example, conductive traces may be arrayed as a plurality of concentric circles with another set of conductive traces being radially extending lines. Conductive patches or pads may be similarly arranged, thus forming a plurality of touch sensors that may be considered as having distinct radius and angle coordinates. Furthermore, touch sensor configurations may also be formed so that sensors are arranged in any number of dimensions and orientations, including but not limited to, diagonal, concentric circle, three-dimensional or random orientations.

Returning to the embodiment of FIG. 4, conductive pads or patches forming touch sensors may also be electrically connected to various integrated circuits (ICs). Here again, there may be a variety of approaches or techniques to connect one or more ICs. Accordingly, in FIG. 4, a side view is provided to depict a simplified high-level touch sensor configuration embodiment. Here, conductive traces or conductive pads may be routed to an edge of the substrate so that a flexible printed circuit (FPC), such as 409 in FIG. 4, or other type of circuit, such as an IC, may be bonded to an area of the substrate. In this particular embodiment, an FPC or an IC may be connected to a configuration of touch sensors using an anisotropic conductive film (ACF) or paste, such as illustrated in FIG. 4 by 410, although claimed subject matter is not limited in scope in this respect.

Likewise, in some embodiments, an arrangement of touch sensors may be electrically connected to one or more drive circuits or one or more sense circuits. As one possible example, without limitation, a sense circuit may be operable to detect changes in capacitance indicative of a touch or near touch and transmit electrical signals representative thereof (e.g., an array of capacitance signal values corresponding to a plurality of touch sensor locations in a configuration of touch sensors) to a processor. However, in some embodiments, a sensing circuit may include the capability to process or in some form pre-process the capacitance signal values so that at least partially processed signal values may be provided for additional processing to another component, such as a processor or the like. In this context, a processor may include, for example, a controller or microcontroller, a digital signal processor, a microprocessor or an application specific integrated circuit (ASIC) containing processor capabilities, to provide several processor examples. Likewise, virtually any number of processors or ICs may be employed, depending, for example, at least in part on the particular application or the particular embodiment.

In some embodiments, a drive circuit may apply a voltage or current drive signal (e.g., a periodic signal) to one or more drive lines in the touch sensor panel. A relationship between this drive signal and a signal appearing at touch sensor locations may be a function of capacitive coupling, which may be affected by an object in contact with or in proximity to a touch sensor.

Returning to FIG. 3, an example process flow embodiment for producing an OLED structure embodiment is illustrated. As suggested previously, any or all approaches or techniques applicable to fabrication of an OLED structure embodiment may be encompassed within the scope of claimed subject matter. Therefore, the approaches, techniques or processes described are provide as illustrations and are not intended to limit the scope of claimed subject matter in any way. In the discussion below, reference shall also be made to the OLED structure embodiment shown in FIG. 5. This particular embodiment of an OLED structure may be referred to as an anode-common structure; though, as just mentioned, the scope of claimed subject matter may include any or all variations of OLEDs, including, but not limited to, cathode-common structures, dual-plate OLED (DOD) structures, active or passive matrix OLED structures, or the like.

Figure 5:
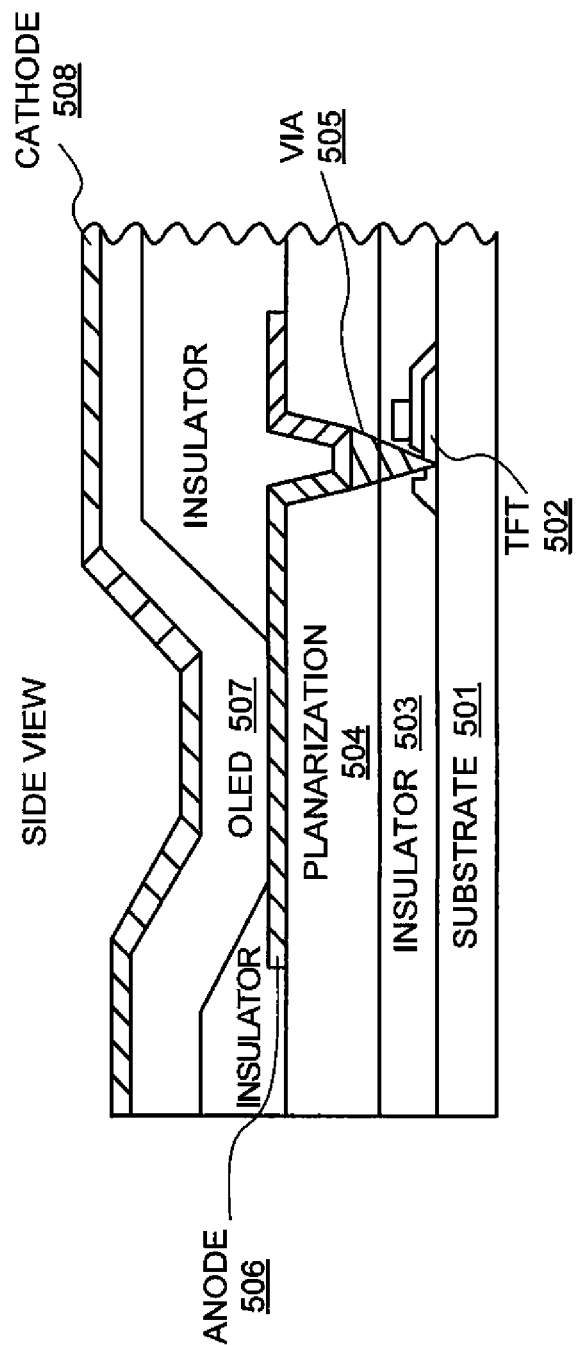
FIG. 5 is a side view illustrating an example OLED structure embodiment.

At block 310, a substrate, such as substrate 501 shown in FIG. 5, may be prepared for fabrication of an array or configuration of driving transistors, for example. Although claimed subject matter is not limited in scope in this respect, here, the driving transistors may include thin-film transistors (TFTs). At block 311, a transistor, such as TFT 502, shown in FIG. 5, may be formed on the substrate. Fabrication of transistors is a reasonably well understood technology and, therefore, will not be discussed at length here.

At block 312, an insulating layer, such as insulator 503 illustrated in FIG. 5, may be formed over the transistors. This insulating layer may assist in lessening electrical interferences, such as parasitic interference, for the TFTs or other electrical components that may be fabricated within the structure embodiment. At block 313, a planarization layer, such as 504 shown in FIG. 5, may be fabricated and form a substantially planar surface for subsequent deposition, patterning or other fabrication processes. At block 314, a via, such as via 505 in FIG. 5, may be formed and filled with conductive material, such as metallization, for example, as illustrated by block 315.

At block 316, a layer of organic light emitting (OLE) material may be applied or deposited over the metallization, forming anode 506 as shown in FIG. 5. Another metallization layer, in this embodiment forming a cathode 508, as shown in FIG. 5, may be formed over OLED layer 507. In this discussion the fabrication process has been simplified so as to avoid obscuring claimed subject matter. A host of manufacturing processes or operations may be involved in fabrication of a particular OLED structure embodiment, such as to fabricate additional layers, for example, that have not been mentioned specifically here. At block 318, one or more finishing operations may be performed, such as encapsulation, planarization, or various other techniques or approaches typically utilized in the fabrication of an OLED structure embodiment.

Figure 6:
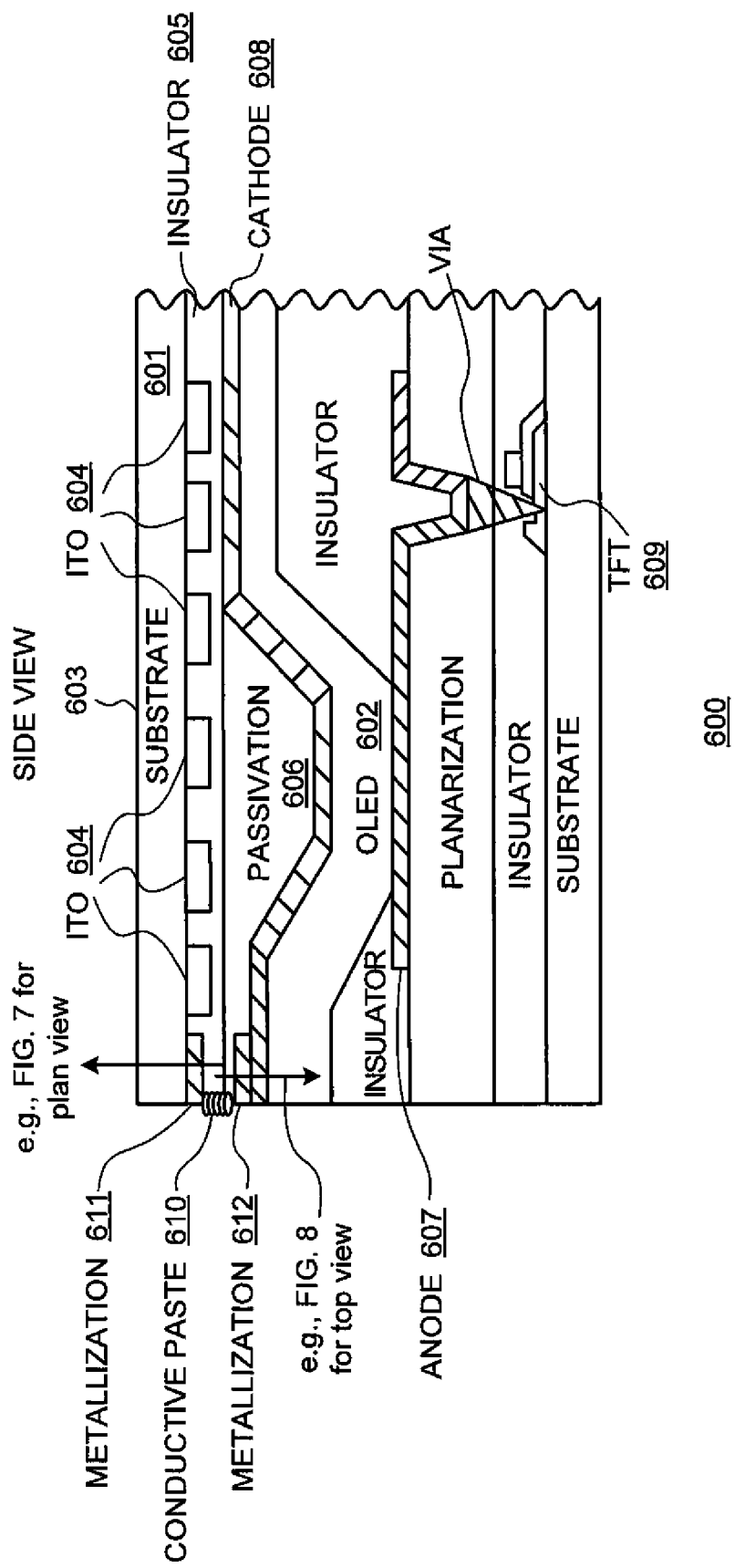
FIG. 6 is a side view illustrating an example touch actuated sensor configuration embodiment integrated with an example OLED structure embodiment in a module or integrated circuit embodiment.

FIG. 6 is a side view of a schematic diagram of one embodiment 600 of a passive touch actuated sensor configuration embodiment integrated with an OLED structure embodiment. It is noted that a variety of alternate module or IC embodiments are possible, as discussed in more detail below. In this particular embodiment, however, a passive touch actuated sensor configuration embodiment having a glass substrate 601 includes touch sensors formed on one side of the glass substrate. In this embodiment, the side of the substrate on which the touch sensors are formed is the side least remote from the OLE material 602 of the OLED structure embodiment. Thus, the glass substrate forms a touch sensitive surface 603 while also providing protection for the OLED structure embodiment. In the particular embodiment, an SITO sensor configuration, formed by ITO pads or patches 604, for example, is employed, with an insulation layer 605 insulating and protecting the pads or patches for this particular embodiment.

It should be understood, however, that claimed subject matter is not limited in this respect. For example, alternatively, and as explained previously, a DITO sensor configuration may be employed. In such an embodiment, a touch sensor configuration may be formed on one side of a substrate, here a glass substrate, for example, with the other side providing a touch sensitive surface and providing protection for an OLED structure embodiment.

The OLED structure embodiment of module embodiment 600 may include a passivation layer 606. Therefore, in this example embodiment, direct contact between the passive touch actuated sensor configuration embodiment integrated with the OLED structure embodiment may occur between passivation layer 606 and insulation layer 605. Likewise, the OLED structure embodiment may include metallization layers 607 and 608 sandwiching OLE material 602. Insulation material may be provided where appropriate to fill gaps in the structure embodiment between the portion of the structure including an array of OLED pixels to form the OLED display and the portion of the structure including an array of transistors to drive the OLED pixels. Here, as illustrated for example by TFT 609, the driving transistors comprise TFTs. In this particular context, the term OLED pixel or display pixel refers to a structure that includes a red pixel, a green pixel and a blue pixel.

In some embodiments, control signals, power and ground typically employed to operate an OLED structure are provided through one or more flexible printed circuits (FPCs; not shown in FIG. 6). Furthermore, in some embodiments, drive and sense lines for the passive touch actuated sensor configuration may be routed on or off a sensor configuration using one or more FPCs (see, e.g., FIG. 4). In such embodiments, two FPCs may be employed, one for an OLED structure, and one for a passive touch actuated sensor configuration. However, in other embodiments, drive and sense lines may be routed through an OLED structure. For example, in such embodiments, conductive material, such as patches of conductive paste may be utilized to provide separate electrical connections for drive and sense lines, for example. Although claimed subject matter is not limited in scope in this respect, in this manner, as one example, a single FPC may be coupled to an OLED structure to provide signals to and from the OLED structure and the passive touch actuated sensor configuration. One advantage in this example, of course, is reducing an FPC.

Figure 7:
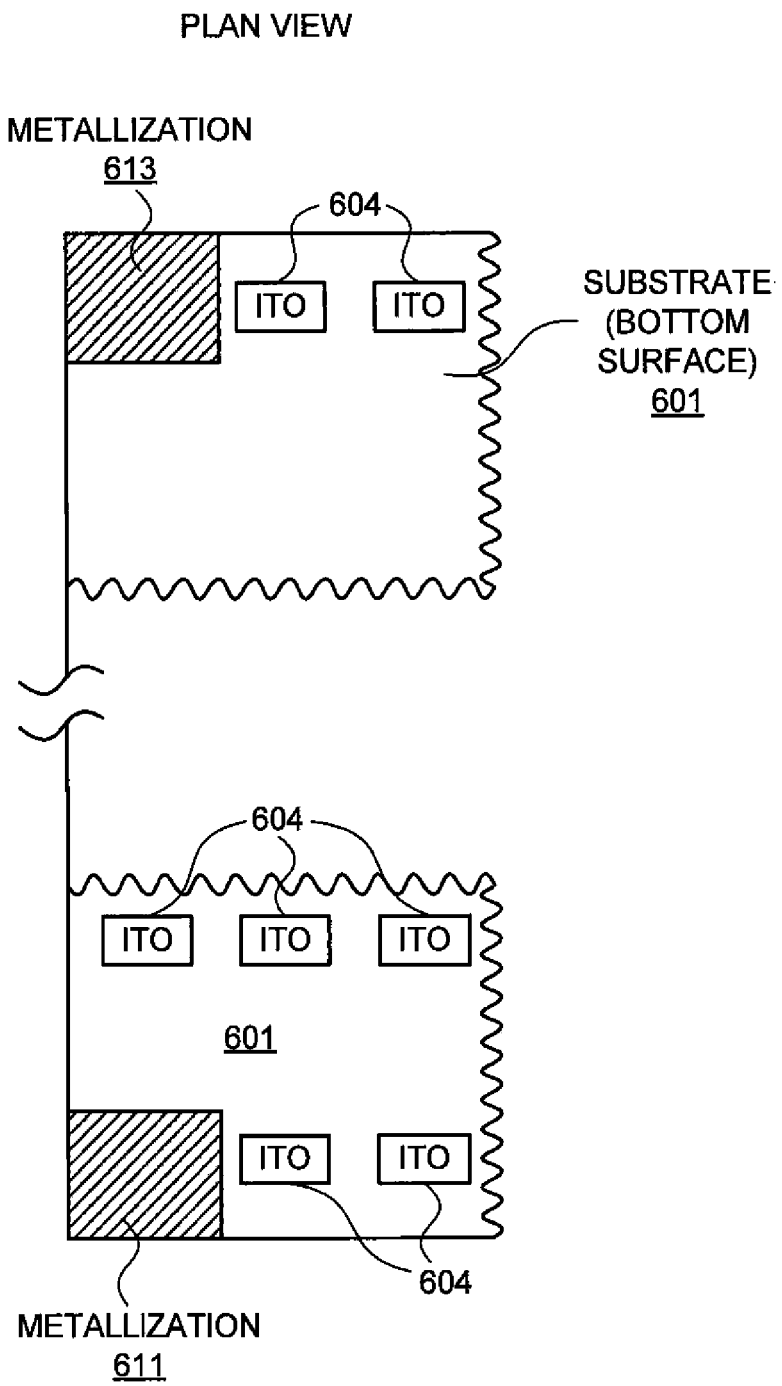
FIG. 7 is a plan view illustrating a bottom surface of a substrate for an example touch sensor configuration embodiment.
Figure 8:
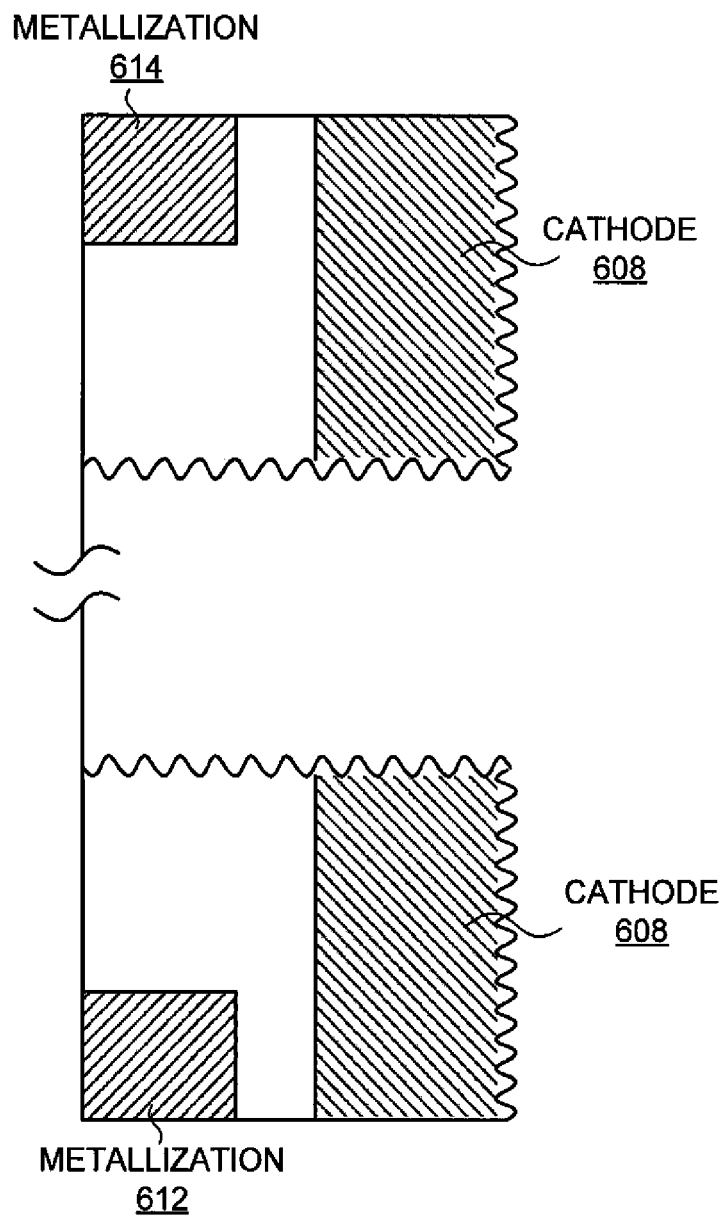
FIG. 8 is a plan view illustrating a top surface for an example OLED structure embodiment.

Arrows shown in FIG. 6 correspond to directional of views as shown in FIG. 7 and FIG. 8. Referring to FIG. 7, to route drive signals onto the passive touch actuated sensor configuration and onto certain drive ITO patterns 604, and to route sense signals from other sense ITO patterns off the passive touch actuated sensor configuration, metallization 611 may be formed in border areas of substrate 601 in a passive touch actuated sensor configuration, for example. Although not shown in FIG. 6, metallization 611 may include a number of individual traces representing different drive or sense lines for the ITO pads or patches. As mentioned above, patches of conductive paste 610 or other conductive material (illustrated for example in FIG. 6) may be used to electrically connect metallization 611 on the passive touch actuated sensor configuration to metallization 612 on the OLED structure. Metallization 612 may be electrically connected to a FPC attached to the OLED structure to route drive or sense signals on or off module, for example. Metallization 612, which is connected to metallization 611 through paste 610, is not directly connected to cathode 608, despite the side view of FIG. 6, and as further illustrated in FIG. 8. As described in the next paragraph, and shown in FIG. 8, for example, there may be another metallization area for connecting power or ground to the cathode 608.

Although not shown in FIG. 6 due to the side view, a different metallization may be employed to electrically couple to cathode 608 in this example embodiment. This metallization may also be electrically connected to the FPC attached to the OLED structure to route either power or ground onto the module and bias the cathode. Of course, this is merely one example embodiment and claimed subject matter is not limited in scope to this particular layout or approach.

FIG. 7 illustrates a bottom view of substrate 601 including ITO pads 604 and metallization 611. FIG. 7 also illustrates metallization 613, which is not shown in FIG. 6 because it is blocked by the side view of the module embodiment. Here, for example, metallization 611 depending at least in part on the particular embodiment, may route to ITO patches 604 formed as part of a single drive line, although it is understood that a drive line may be formed from other structures as well (e.g., continuous rows, diamond shapes, pyramid shapes, and the like). ITO patches 604 connect to metallization 611 (not shown) and metallization 611 is to be electrically connected to metallization 614 via conductive paste. In contrast, metallization 613, depending at least in part on the particular embodiment, may route to ITO patches 604 formed as part of a single sense line, although it is understood that a sense line may be formed from other structures as well (e.g., continuous columns, diamond shapes, pyramid shapes, and the like). Likewise, ITO patches 604 connect to metallization 613 (not shown) and metallization 613 is to be electrically connected to metallization 614 via conductive paste.

FIG. 8 illustrates a top view of the OLED structure embodiment including metallization 614 and 612, which may be coupled to a FPC. Metallization 614 shown in FIG. 8 does not appear in FIG. 6, for a similar reason explained with respect to metallization 613. As noted previously and illustrated by FIG. 8, in this particular example, metallization 614 and 612 do not electrically contact cathode 608.

Yet another embodiment in accordance with claimed subject matter may include two substrates. The first substrate of the two substrates may include, on a first of two sides, a first layer comprising passive touch actuated sensors. The second of the two substrates may include, on a first of two sides, a first layer comprising driving thin-film transistors and a second layer comprising an OLE material sandwiched between metallization sub-layers. For this particular embodiment, the first and second layers of the second substrate may be mutually adjacent and arranged so that at least some of the thin-film transistors of the first layer are capable of electrically driving at least a portion of the OLE material sandwiched between metallization sub-layers. Likewise, the two substrates may be oriented so that the second side of the first substrate is most remote from the second side of the second substrate; that is, these may form the outer surfaces of the module or IC, for example.

In this particular embodiment, passive touch actuated sensors of the first layer on the first substrate may be electrically connected to a least remote metallization sub-layer of the OLED structure. As explained for previous embodiments, the passive touch actuated sensors of the first layer on the first substrate are thus capable of being electrically coupled to a power source or to ground, such as via a metallization sub-layer, such as a thin-film transistor layer on the second substrate, for example.

In addition to the embodiments just discussed, a variety of additional module or IC embodiments are possible and included within the scope of claimed subject matter. For example, an embodiment may include more than one substrate included within a touch actuated sensor configuration embodiment. Thus, a touch sensor configuration may be sandwiched between two glass substrates, with one forming a protective outer cover glass while the other substrate includes ITO pads or patches formed on it. Whereas FIG. 6 illustrates touch sensors on the surface of substrate 601 least remote from OLE material 602, the touch sensors may also be on the surface of a substrate most remote from the OLE material, if desired, since a protective outer cover glass is also provided. Likewise, a DITO touch sensor configuration may be employed that is similarly sandwiched between glass substrates with an insulating layer within the configuration to separate the ITO layers. A host of other arrangements are also possible and claimed subject matter is not intended to be limited to any particular arrangement. All arrangements or embodiments are intended to be within the scope of claimed subject matter.

Figure 9:
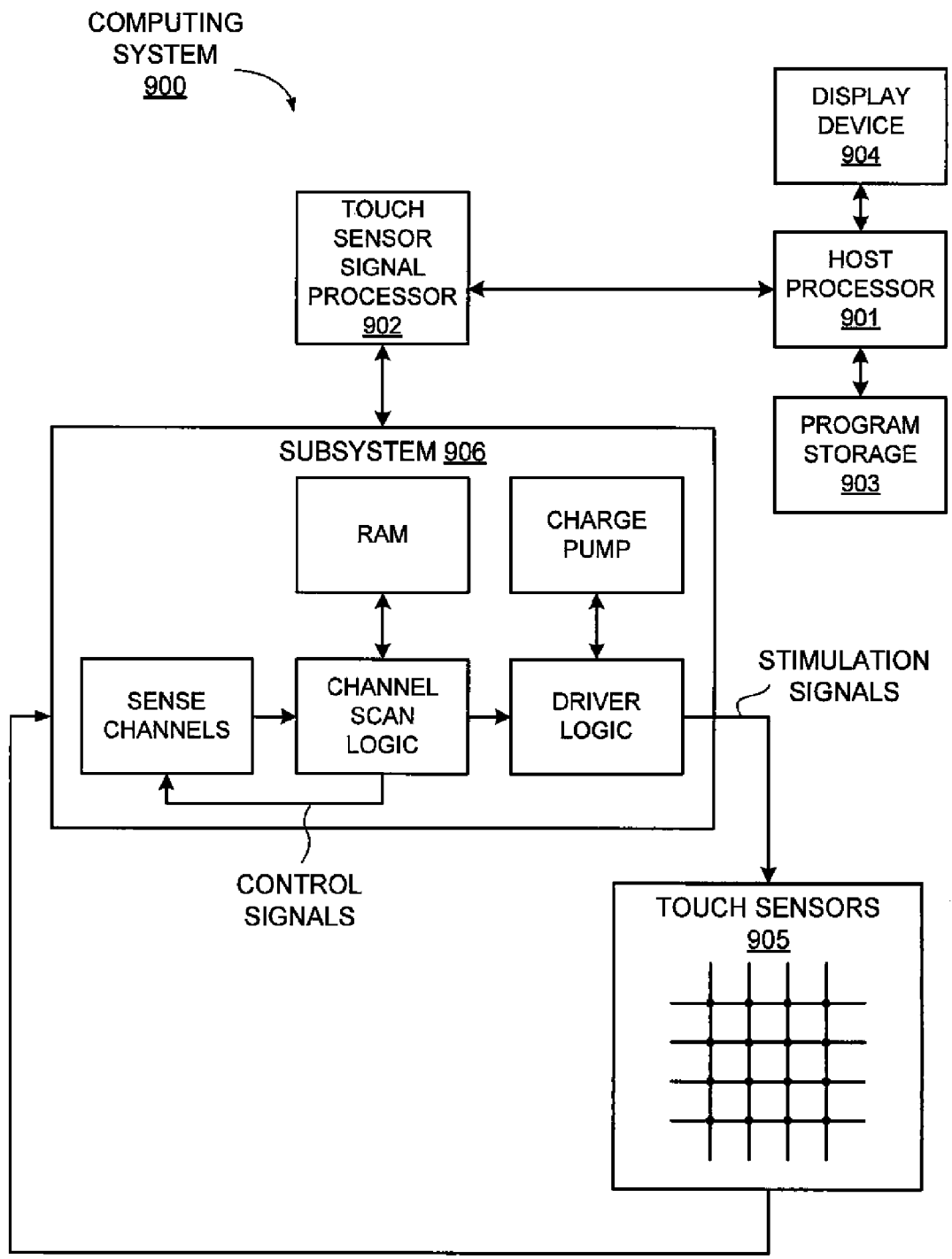
FIG. 9 is a block diagram illustrating an example computing system embodiment.

FIG. 9 illustrates a computing system embodiment 900 which may employ a module or IC embodiment formed by integrating a passive touch actuated sensor configuration embodiment with an OLED structure embodiment. For example, display device 904 and touch sensors 905 may be integrated in a module or IC. Computing system 900 may include host processor 901. Host processor 901 may perform functions, which may or may not be related to processing touch sensor signals, and may be connected to program storage 903 and display device 904, for providing a user interface for the device. Host processor 901 may also be operable to receive electrical signals from touch sensor signal processor 902. Touch sensor processor 902 processes signals from touch sensor configuration subsystem 906. Touch sensors 905 provide signals to subsystem 906. Host processor 901 may be capable of performing actions based at least in part on signals from touch sensor signal processor 902 that may include, but are not limited to, moving an object, such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing volume or other audio settings, storing signal information related to telephone communications such as addresses, frequently dialed numbers, received calls, missed calls, logging onto a computer, a computing device, or a network, permitting authorized individuals access to restricted areas of the computer, computing device, or network, loading a user profile associated with a user's preferred arrangement of a computer or computing device desktop, permitting access to web content, launching a particular program, encrypting or decoding a message, or the like.

A computing device or system, such as embodiment 900, by way of example, may include firmware. Firmware may also be propagated within any transport medium for use by or in connection with an instruction execution system, apparatus, or device, such as a computer-based system, processor-containing system, or other system that is able to access instructions from an instruction execution system, apparatus, or device and execute the instructions. In this context, a "transport medium" may be any medium that is able to communicate, propagate or transport a computer or computing program for use by or in connection with the instruction execution system, apparatus, or device. The transport readable medium may include, but is not limited to, an electronic, magnetic, optical, electromagnetic or infrared wired or wireless propagation medium.

Figure 10:
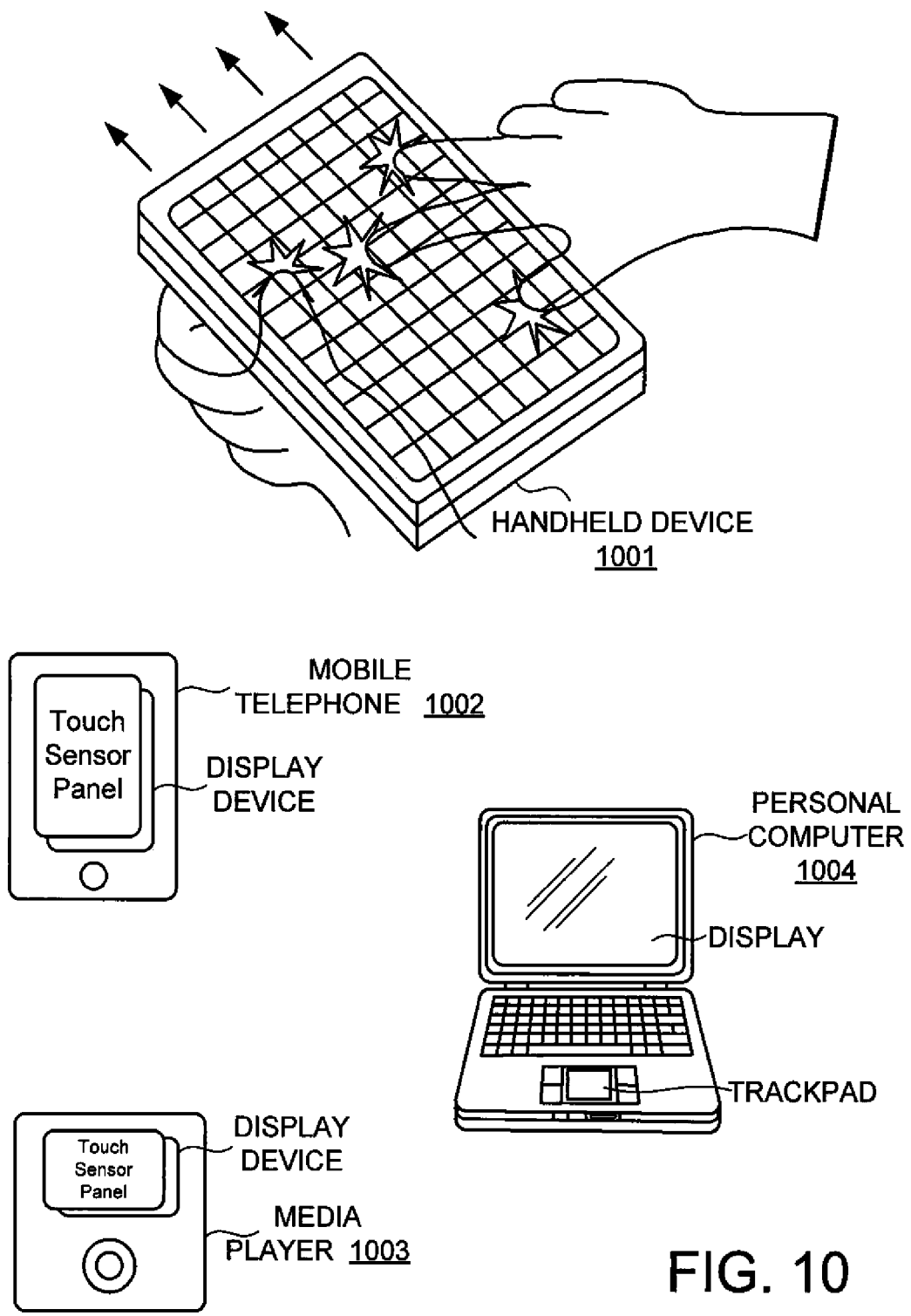
FIG. 10 is a schematic diagram illustrating various example device embodiments.

FIG. 10 is a schematic diagram illustrating various devices which may include or employ a module or IC embodiment formed by integrating a passive touch actuated sensor configuration embodiment with an OLED structure embodiment. For example, hand held device embodiments 1001, 1002 or 1003 may include a module or IC embodiment formed by integrating a passive touch actuated sensor configuration embodiment with an OLED structure embodiment and may be capable of transmitting signals to or receiving signals from various other devices, such as via a wired or wireless communication interface. Embodiment 1001 corresponds to the embodiment previously illustrated by FIG. 1, for example. Likewise, a mobile telephone embodiment 1002 is depicted, as is a digital media player embodiment 1003 and a personal computer embodiment 1004. These devices may have improved overall functionality or reliability, may be manufactured at a lower cost or with higher yield, or may exhibit characteristics which consumers may find desirable, such as being smaller, lighter, thinner, or the like.

While there are numerous particular advantages to this particular exemplary embodiment, one advantage may be that the previously described embodiments may result in a better yield, and potentially lower costs, during the manufacturing process. Similarly, embodiments in accordance with claimed subject matter may allow devices to be smaller, lighter, or thinner, which consumers generally find desirable. For example, after fabrication of a module, such as one of the previously described embodiments, the outer glass substrates may be thinned, such as by chemical polishing, mechanical polishing, other processes, or by a combination of a variety of processes.

Although embodiments have been fully described with reference to the accompanying drawings, it is to be noted that various changes or modifications may become apparent to those skilled in the art. Such changes or modifications are to be understood as being included within the scope of claimed subject matter.

What is claimed is:

1. A device comprising:
a touch actuated sensor configuration integrated with an OLED structure, the device comprising:
a first substrate and a second substrate;
the first substrate having a touch actuated sensor which includes:
on a first of two sides of the first substrate, at least one of a plurality of drive lines or a plurality sense;
a metallization formed on the first of the two sides of the first substrate routed to one of the plurality of drive lines or the plurality of sense lines;
wherein the second substrate on a first of two sides includes:
a first layer comprising driving thin-film transistors;
a second layer comprising an OLE material;
a first metallization sub-layer disposed on one side of the OLE material;
a second metallization sub-layer disposed on the other side of the OLE material;
the first and second layers being and arranged so that at least some of the thin-film transistors of the first layer of the second substrate are capable of electrically driving at least a portion of the OLE material;
wherein:
the two substrates are oriented so that the second side of the first substrate and the second side of the second substrate are oppositely directed toward each other; and
the metallization formed on the first of the two sides of the first substrate is routed to one of the plurality of drive lines or the plurality of sense lines and is electrically and physically connected to a metallization (612) on the second substrate.

2. The device of claim 1, wherein the touch actuated sensor configuration comprises a capacitive touch actuated sensor configuration.

3. The device of claim 1, wherein the touch actuated sensor configuration comprises an array of touch sensors, wherein the OLED structure comprises an array of OLED pixels.

4. The device of claim 3, wherein the OLED structure includes transistors connected to the array of OLED pixels so as to electrically drive pixels of the array.

5. The device of claim 1, wherein the touch actuated sensor configuration comprises an array of capacitive touch sensors, and wherein the capacitive touch sensors comprise a pattern of ITO patches.

6. The device of claim 1, wherein the touch actuated sensor configuration comprises an array of capacitive touch sensors, and wherein the array of capacitive touch sensors and the OLED structure are electrically connected via a conductive paste.

7. The device of claim 6, wherein the conductive paste comprises a cured conductive paste forming conductive patches providing electrical connections for the array of capacitive touch sensors.

8. The device of claim 1, wherein at least one of the first and second substrates of the device comprise glass and wherein the one or more glass substrates have been thinned.

9. A method of fabricating the device of claim 1, comprising:
fabricating the touch actuated sensor configuration on the first substrate and the OLED structure on the second side of the second substrate; and
combining the touch actuated sensor configuration and the OLED structure into a single module so that one or more respective touch sensors of the touch actuated sensor configuration are electrically connected within the single module to the OLED structure via a conductive paste.

10. The method of claim 9, wherein the configuration and the structure are fabricated by separate processes.

11. The method of claim 10, wherein the processes for fabricating the configuration occur at temperatures or pressures that are different from the processes for fabricating the structure.

12. The method of claim 9, further comprising curing the conductive paste.

13. The method of claim 12, wherein the curing the conductive paste comprises at least one of the following: applying heat; applying pressure; applying radiation; or any combination thereof.

14. The method of claim 9, wherein at least one of the first and second substrates comprises a glass substrate; and the method further comprising: thinning the at least one of the first and second substrates that comprises the glass substrate.

15. The method of claim 9, wherein the conductive paste comprises at least one of the following: silver; gold; adhesive; polymer; or any combination thereof.

16. The method of claim 9, wherein the fabricating a touch actuated sensor configuration comprises fabricating a capacitive touch actuated sensor configuration that comprises at least one of the following: a SITO configuration; or a DITO configuration.

17. A device comprising:
a first substrate and a second substrate;
the first substrate having a touch actuated sensor which includes:
on a first of two sides of the first substrate at least one of a plurality of drive lines or a plurality of sense lines;
a metallization formed on the first of the two sides of the first substrate routed to one of the plurality of drive lines or the plurality of sense lines;
wherein the second substrate on a first of two sides includes:
a first layer comprising driving thin-film transistors;
a second layer comprising an OLE material;
a first metallization sub-layers disposed on one side of the OLE material;
a second metallization sub-layer disposed on the other side of the OLE material;
the first and second layers of the second substrate arranged so that at least some of the thin-film transistors of the first layer of the second substrate are capable of electrically driving at least a portion of the OLE material;
wherein
the two substrates are oriented so that the second side of the first substrate and the second side of the second substrate are oppositely directed from each other; and
the metallization formed on the first of the two sides of the first substrate is electrically and physically connected within the device to a metallization on the second substrate.

18. The device of claim 17, wherein a conductive paste electrically and physically connects the metallization formed on the first of the two sides of the first substrate with the metallization on the second substrate.

* * * * *

UNITED STATES PATENT AND TRADEMARK OFFICE
CERTIFICATE OF CORRECTION

PATENT NO. : 8,624,849 B2
APPLICATION NO. : 12/426912
DATED : January 7, 2014
INVENTOR(S) : Chang et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 713 days.

Signed and Sealed this
Twenty-sixth Day of May, 2015

Michelle K. Lee
*Director of the United States Patent and Trademark Office*